(12) United States Patent
Karthaus

(10) Patent No.: US 8,045,950 B2  
(45) Date of Patent: Oct. 25, 2011

(54) MIXER CIRCUIT, RECEIVING CIRCUIT, TRANSMITTING CIRCUIT, AND METHOD FOR OPERATING A MIXER CIRCUIT

(75) Inventor: Udo Karthaus, Ulm (DE)

(73) Assignee: Atmel Corporation, San Jose, CA (US)

( * ) Notice: Subject to any disclaimer, the term of this patent is extended or adjusted under 35 U.S.C. 154(b) by 1068 days.

(21) Appl. No.: 11/808,416

(22) Filed: Jun. 8, 2007

(65) Prior Publication Data
US 2007/0264961 A1 Nov. 15, 2007

Related U.S. Application Data

(63) Continuation of application No. PCT/EP2005/013111, filed on Dec. 7, 2005.

(30) Foreign Application Priority Data

Dec. 8, 2004 (DE) .......................... 10 2004 059 117

(51) Int. Cl.  
*H04B 1/26* (2006.01)

(52) U.S. Cl. ........ 455/313; 455/323; 455/334; 455/317; 455/318; 455/333; 331/167; 331/177 V; 331/117 R

(58) Field of Classification Search .................. 455/313, 455/323, 334, 317, 318, 333, 341; 331/167, 331/177 V, 117 R  
See application file for complete search history.

(56) References Cited

U.S. PATENT DOCUMENTS

| | | | |
|---|---|---|---|
| 4,590,433 A | 5/1986 | Kusakabe et al. | |
| 6,307,894 B2 * | 10/2001 | Eidson et al. | 375/297 |
| 6,348,830 B1 | 2/2002 | Rebeiz et al. | |
| 6,480,046 B1 | 11/2002 | Camp, Jr. | |
| 6,535,725 B2 * | 3/2003 | Hatcher et al. | 455/317 |
| 6,542,019 B1 | 4/2003 | Lim et al. | |
| 7,075,345 B2 | 7/2006 | Umeda et al. | |
| 7,099,646 B1 * | 8/2006 | Jin et al. | 455/313 |
| 7,676,212 B1 * | 3/2010 | Jin et al. | 455/313 |
| 2002/0013137 A1 | 1/2002 | Asam | |

FOREIGN PATENT DOCUMENTS

EP 1 292 018 3/2003

OTHER PUBLICATIONS

"Minolithische Integration von Frequenzumsetzern bis 45 GHz in Silizium und SiGe," by Sabine Hackl, Feb. 2002 at the Unitversity of Vienna.

* cited by examiner

*Primary Examiner* — Sanh Phu  
(74) *Attorney, Agent, or Firm* — Baker Botts L.L.P.

(57) ABSTRACT

A mixing circuit is provided that includes a charge circuit, an oscillating circuit inlet step which is connected to a circuit which feeds an oscillating signal, and a signal inlet step. The oscillating circuit inlet step comprises at least two bipolar-transistors and the emitters thereof are connected to a constant potential which is independent from the oscillating signal. The mixing circuit is used, preferably, in a base station or a mobile radio device of a cellular radio network.

15 Claims, 3 Drawing Sheets

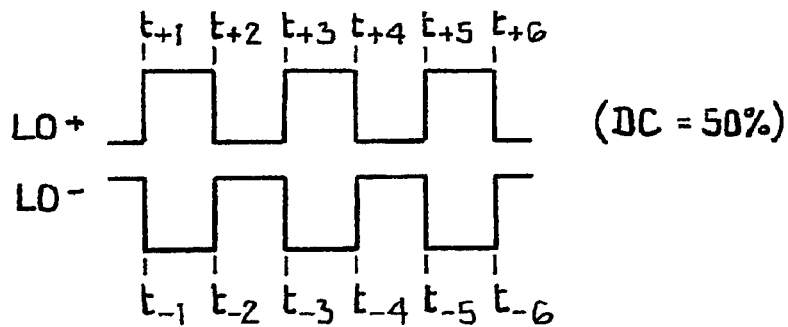
(DC = 50%)  FIG. 5a
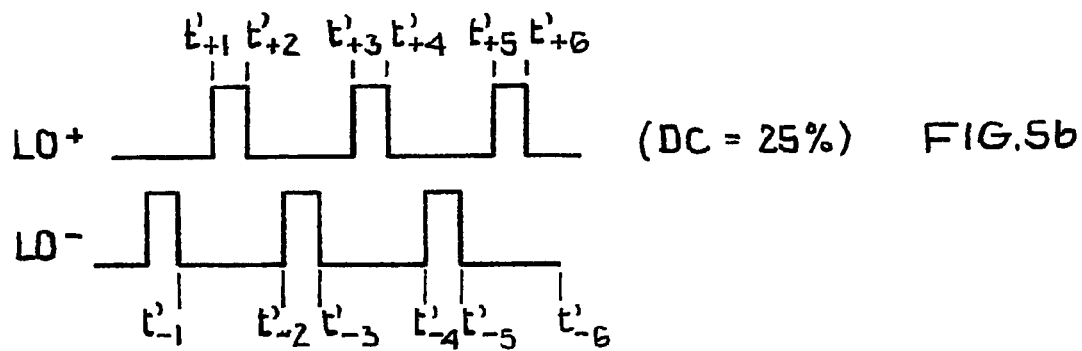
(DC = 25%)  FIG. 5b
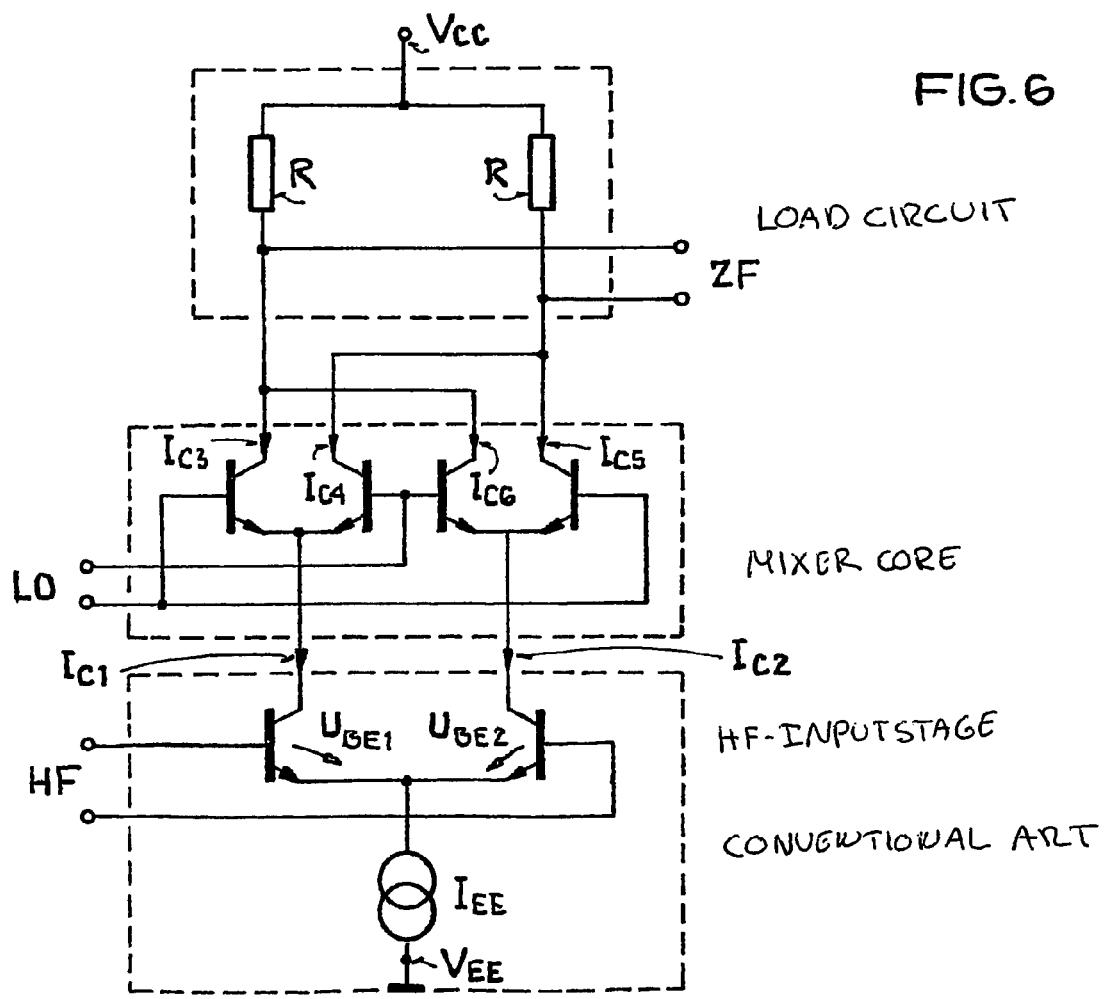
FIG. 6
CONVENTIONAL ART

MIXER CIRCUIT, RECEIVING CIRCUIT, TRANSMITTING CIRCUIT, AND METHOD FOR OPERATING A MIXER CIRCUIT

This nonprovisional application is a continuation of International Application No. PCT/EP2005/013111, which was filed on Dec. 7, 2005, which claims priority to German Patent Application No. DE 102004059117, which was filed in Germany on Dec. 8, 2004, and which are both herein incorporated by reference.

BACKGROUND OF THE INVENTION

1. Field of the Invention

The present invention relates to a mixer circuit, a receiving circuit, a transmitting circuit, and a method for operating a mixer circuit.

2. Description of the Background Art

From the dissertation entitled, "Monolithische Integration von Frequenzumsetzern bis 45 GHz in Silizium und SiGe," (monolithic integration of frequency converters to 45 GHz in silicon and SiGe), page 22 ff., by Sabine Hackl, February 2002 at the University of Vienna, various types of the Gilbert cell are known as mixer circuits, such as is shown in FIG. 6 by way of example.

The Gilbert cell shown in FIG. 6 includes a load circuit (R), a mixer core for the LO input, and an HF input stage. Each of the input stages has an emitter-coupled transistor pair. If you consider the DC transfer characteristic of this emitter-coupled transistor pair in terms of large-signal behavior, the function is described by tanh. The input of the mixer core is connected to a local oscillator (LO). In addition, the mixer core is connected to the load circuit, and the emitters of the npn transistors of the mixer core are connected to the HF input stage.

Depending on how the input stages are driven, the Gilbert cell is used as a mixer, modulator, demodulator, multiplier, or phase detector.

If both input voltages present at the inputs HF and LO are in the linear region of the transfer characteristic, the circuit is used as a multiplier. Optimization for high linearity with respect to both inputs, and high output power are desirable in this context.

For mixers and modulators, small signals, which are in the linear region of the characteristic, are present at the HF input, while the LO input takes in switching signals that are limited. The circuit is optimized for minimal noise figure and high linearity with respect to the HF input. If high input voltages, which are in the saturation region of the overall circuit, are applied to both inputs, this circuit is used as a phase detector.

Optimal driving of the LO input stage for mixers and modulators is by means of square wave signals. In practice, however, only sinusoidal signals are generally available, which entail losses. These losses have the effect of longer transition times between two states than is the case for square wave signals, which in turn contributes to increasing the noise figure and reducing the gain. In order to keep these losses low, high LO power is necessary. A loss in gain is caused by sinusoidal voltages at the LO input.

The signal to be mixed is fed to the differential HF input of the Gilbert cell. The "bottom" current switching stage serves as an amplifier. In the "top" stage, the signal is switched back and forth between the two load resistors at the rate of the LO signal. (A variant with bipolar transistors as "current switches" is shown here.)

Hence, the signal to be mixed is multiplied by a square wave function. Since a square wave function can also be represented as the sum of sinusoidal oscillations at the fundamental frequency and the odd multiples thereof, this method corresponds to multiplicative mixing with the distinction that a filtering of the output signal should be performed in this case because of the harmonics of the square wave function.

An improved mixer circuit is known, for example, from U.S. Pat. Nos. 6,542,019, 6,348,830 B1 using bipolar transistors, or U.S. Pat. No. 6,480,046 B1 using field-effect transistors. In U.S. Pat. No. 4,590,433, the transistors of the two differential amplifiers are controlled for low power consumption such that either all four transistors of the two differential amplifiers are conductive, or that only one respective transistor of a differential amplifier is non-conductive.

SUMMARY OF THE INVENTION

It is therefore an object of the present invention to provide a circuit whose noise or current consumption is reduced as much as possible, and whose efficiency is improved as much as possible in so doing.

Accordingly, a mixer circuit is provided that has a load circuit and has an oscillator circuit input stage connected to a circuit that generates an oscillating signal (also known as a local oscillator), and also has a signal input stage. The oscillator circuit input stage has at least two bipolar transistors, whose emitters are connected to a constant voltage that is independent of the oscillating signal, such as ground or an operating voltage, for example. In this context, the oscillator circuit input stage with the at least two bipolar transistors of the mixer circuit is designed to switch one or more currents of the mixer circuit.

Such wiring of these two bipolar transistors permits switching operation that depends on the oscillating signal, in particular on its period. The circuit emitting the oscillating signal includes a (local) oscillator with preferably one resonant circuit, which advantageously has a quartz crystal. In addition, this circuit which emits the oscillating signal can have additional subcircuits such as an amplifier or a tunable filter, for example.

By rendering the two transistor non-conductive, temporarily and simultaneously, the current to the mixer circuit is temporarily switched off, in particular for a short period of time within a phase of the oscillating signal.

An embodiment of the invention provides that the oscillator circuit input stage is designed such that the two bipolar transistors are temporarily driven into saturation as a function of the oscillating signal. The oscillating signal preferably has a constant frequency, does not itself carry any information, has a sufficiently large amplitude, and ideally is a square wave. The bipolar transistors are preferably switched on in a disjoint manner by this oscillating signal, so that the two bipolar transistors are not simultaneously switched on. These bipolar transistors have a low collector-emitter resistance in saturation. The base of each bipolar transistor is advantageously connected to an input of the mixer circuit. The collector is preferably connected directly to the signal input stage.

Another embodiment of the invention provides that the oscillator circuit input stage has exactly two bipolar transistors or exactly two bipolar transistor arrays, wherein each bipolar transistor array has exclusively individual bipolar transistors connected in parallel, which together function as one bipolar transistor.

Another aspect of the invention is a mixer circuit with a load circuit, an oscillator circuit input stage that is connected to a circuit that generates an oscillating signal, and a signal input stage. In this context, the oscillator circuit input stage has at least two field-effect transistors whose source terminals are connected to a constant voltage that is independent of the oscillating signal, such as ground or the like. In this context, the oscillator circuit input stage with the at least two field-effect transistors of the mixer circuit is designed to switch one or more currents of the mixer circuit.

By rendering the two transistor non-conductive, temporarily and substantially simultaneously, the current to the mixer circuit is temporarily switched off, in particular for a short period of time within a phase of the oscillating signal.

In order to advantageously further develop the invention, the oscillator circuit input stage is designed such that the two field-effect transistors are temporarily driven into the resistive region as a function of the oscillating signal. The field-effect transistors are preferably switched on in a disjoint manner, so that the two field-effect transistors are not simultaneously switched on. These field-effect transistors have a low drain-source resistance in the resistive region. The gate of each field-effect transistor is advantageously connected to an input of the mixer circuit. The drain is preferably connected directly to the signal input stage.

In an embodiment of the invention, provision is made that the oscillator circuit input stage has exactly two field-effect transistors or exactly two field-effect transistor arrays, wherein each field-effect transistor array has exclusively individual field-effect transistors connected in parallel, which together function as one field-effect transistor.

An of the invention provides for the signal input stage to have at least two differential amplifiers, wherein each differential amplifier is connected to a transistor of the signal input stage, which transistor may be a bipolar transistor or a field-effect transistor, and to a load circuit. Further connections of the signal input stage, for example to outputs of the circuit, may be provided in addition to these connections. It is advantageous for the signal input stage to be designed as a differential transconductance stage.

The differential amplifiers can have negative feedback, preferably negative current feedback. Advantageous embodiments of negative current feedback provide an additional emitter resistor or an additional source resistor and/or an additional inductor and/or an additional capacitor. Moreover, a damped resonant circuit or a nonlinear component can also be advantageous as negative current feedback.

In order to be able to drive the transistors into saturation or into the resistive region as quickly as possible, provision is made in an advantageous further development of the invention for the oscillator circuit input stage to be connected to a driver that has a suitable low output resistance so as to quickly charge input capacitances of the oscillator circuit input stage.

Another aspect of the invention is a transmitting circuit with a mixer circuit as explained above. In this context, the circuit emitting the oscillating signal is designed to turn on the two transistors in a time-offset manner as a function of the oscillating signal. For transmitter operation, the mixer circuit is advantageously followed by a power amplifier and a filter.

In especially preferred fashion, provision is made in a further development of the invention that the circuit for emitting the oscillating signal is designed to temporarily, simultaneously switch off the two transistors of the oscillator circuit input stage.

Another aspect of the invention is a receiving circuit with a mixer circuit as explained above. In contrast to the transmitting circuit, the mixer circuit for receiving operation is advantageously followed by differential baseband or intermediate frequency amplifiers and/or filters.

Yet another aspect of the invention is the use of this mixer circuit, this receiving circuit, or this transmitting circuit in a base station or a mobile radio unit of a cellular radio network, in particular in a UMTS network.

Moreover, an aspect of the invention is a method for operating a mixer circuit, in that the mixer circuit is supplied with an oscillating signal that temporarily drives the transistors of the mixer circuit into saturation and/or into a resistive region. In this context, the oscillating signal temporarily switches off the current to the mixer circuit during up-mixing or down-mixing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 5a and 5b illustrate two embodiments of possible oscillating signals.

FIG. 6 illustrates a conventional circuit.

DETAILED DESCRIPTION

Figure 1:
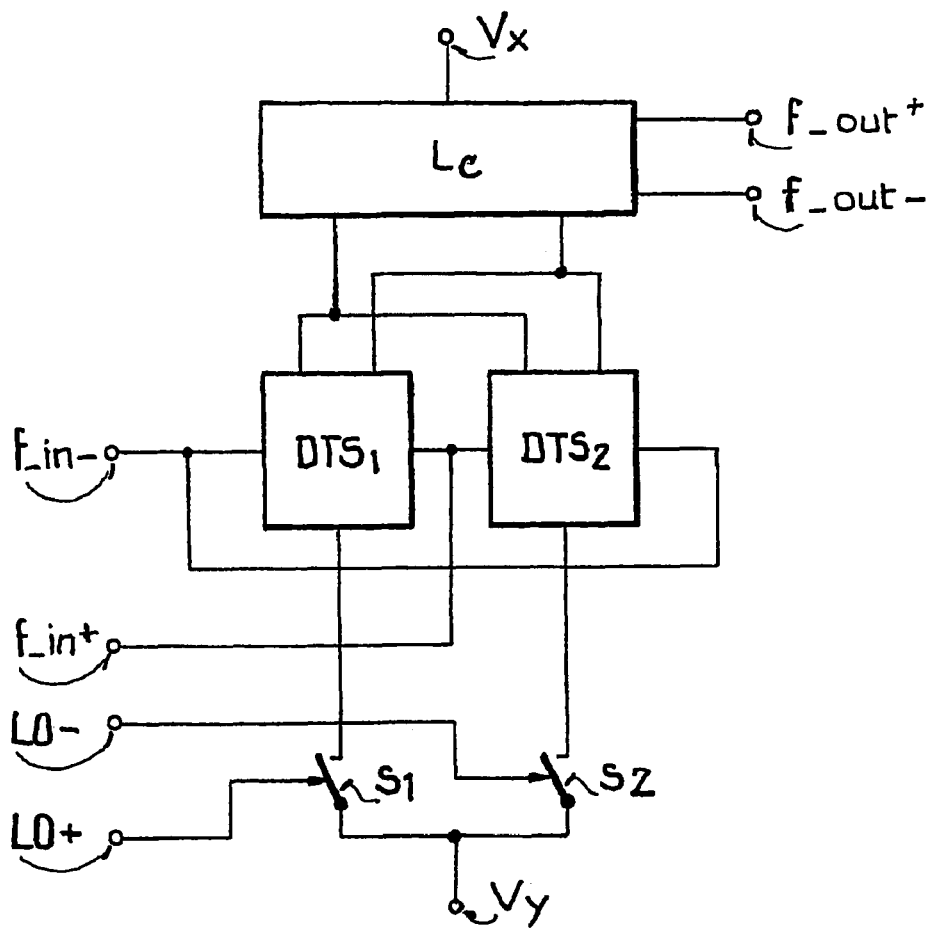
FIG. 1 illustrates a block diagram of a mixer circuit.

The block diagram from FIG. 1 shows a mixer circuit with four inputs (LO−, LO+, f_in−, f_in+), wherein two inputs LO− and LO+ of an oscillator circuit input stage S1, S2 are connected to a (local) oscillator, which generates a carrier frequency or a frequency differing from this frequency (intermediate frequency) for up-mixing and down-mixing for use in a transmitter and for use in a receiver. The signal at these inputs LO− and LO+ has a constant frequency, does not itself carry any information, has a sufficiently large amplitude, and ideally is a square wave. Each of these inputs LO− and LO+ is connected to a transistor S1 or S2 functioning as a switch. Preferably, the oscillating signal of the resonant circuit present at the inputs LO− and LO+ is a square wave signal to a first approximation, which switches the switches S1 and S2.

Figure 2A:
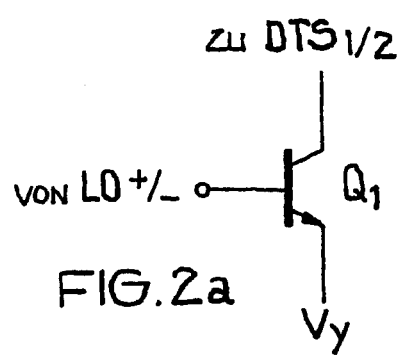
FIGS. 2a through 2d illustrate several embodiments of the switches S1 and S2 from FIG. 1, FIGS. 3a through 3c illustrate several embodiments of differential amplifiers for the signal input DTS1 or DTS2.

Examples of the switches S1 and S2 are shown in FIGS. 2a, 2b, 2c and 2d. FIG. 2a shows an npn bipolar transistor Q1, whose base is connected to the input LO−/+ and whose emitter is connected to the constant voltage Vy, which in this case can be ground (GND), for example, or can assume negative voltage values ($V_{EE}$). The collector is connected to a signal input stage DTS1 or DTS2.

Figure 2C:
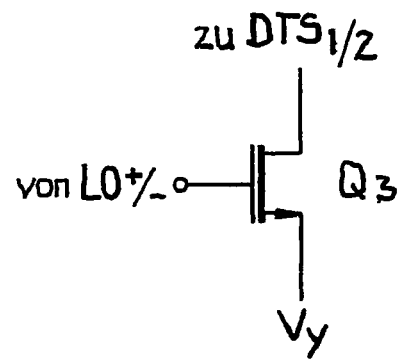
Figure 2B:
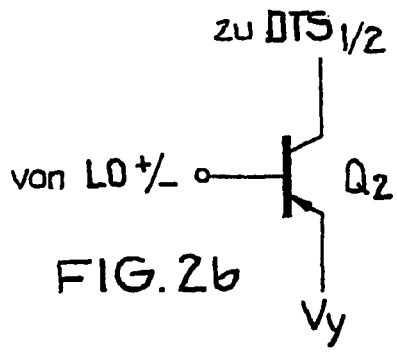
Figure 2D:
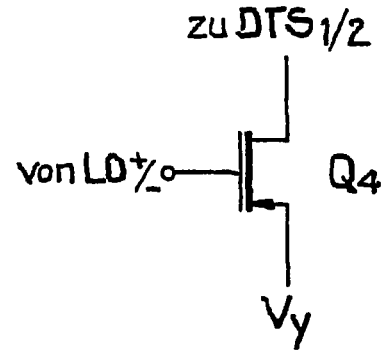

FIG. 2b shows a pnp bipolar transistor Q2, whose emitter again is connected to the constant voltage Vy. In this case, Vy is preferably positive. Preferably, SiGe heterojunction bipolar transistors are used. FIGS. 2c and 2d show the corresponding complementary connections for field-effect transistors Q3 and Q4 as switches S1 and S2. All types of field-effect transistor are suitable here, whether normally-off (enhancement type) or normally-on (depletion type).

In FIG. 1, the signal inputs f_in− and f_in + are connected to the signal input stage DTS1 and DTS2, which in this exemplary embodiment include two differential transconductance stages. Here, any type of transistor (NMOS, PMOS, npn, pnp) can be used for one of the differential transconductance stages DTS1 or DTS2, as is shown by way of example in FIGS. 3a, 3b, and 3c.

Figure 3A:
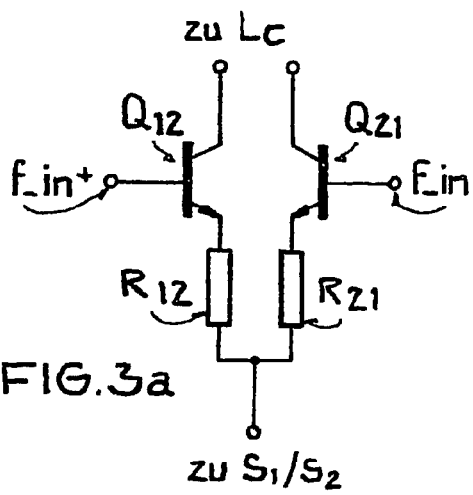
Figure 3B:
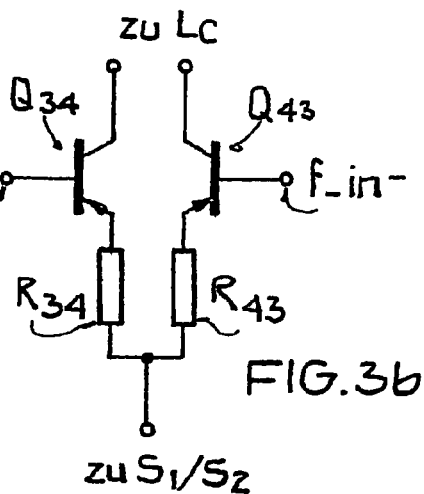
Figure 3C:
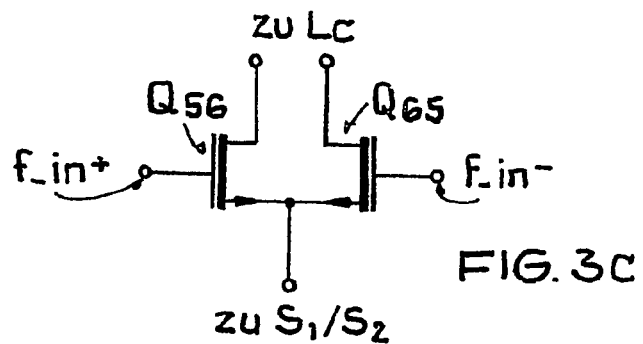
Figure 4A:
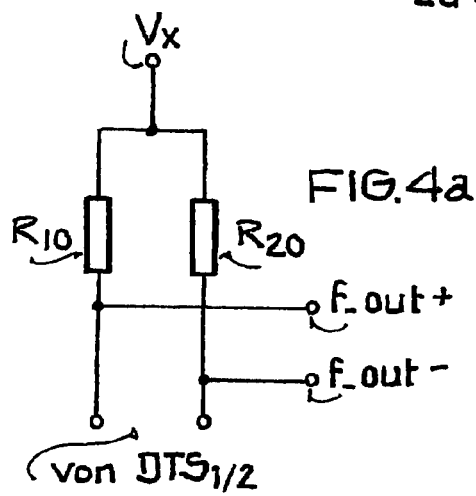
FIGS. 4a and 4b illustrate two embodiments of the load circuit of the mixer circuit.
Figure 4B:
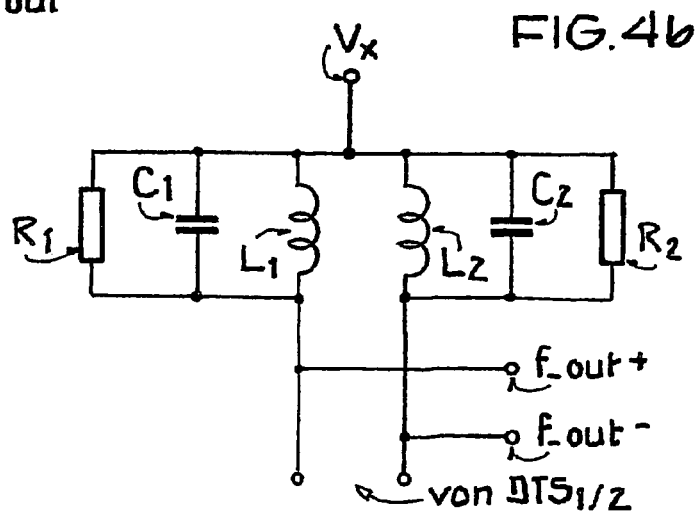

FIGS. 3a and 3b show two exemplary embodiments with negative emitter feedback as negative current feedback. The negative feedback here can be composed of a resistor, as shown in FIGS. 3a and 3b, or alternatively of an inductor or a resonant circuit. In the mixer circuit, the differential transconductance stages DTS1 and DTS2 are each connected to one switch S1 or S2 and also to a load circuit $L_C$. Exemplary embodiments of the load circuit $L_C$ are shown in FIGS. 4a and 4b. In FIG. 4a, simple resistors R10 and R20 are used, and in FIG. 4b damped resonant circuits having the components R1, C1 and L1, or R2, C2 and L2 are used. For example, each differential amplifier DTS1 and DTS2 is connected to the two resistors R10 and R20, which form the load circuit $L_C$.

The up-mixed or down-mixed output signal is available at the outputs f_out− and f_out+ as shown in FIG. 1. With the use of filters, this signal can be transmitted to an antenna or an analysis circuit.

In the switched-on state, only the collector-emitter voltage of, for example, 0.2 V drops across the LO transistors S1 and S2 (Q1 or Q2), so that a larger swing for the input voltages and the output voltage can be achieved as compared to a Gilbert cell. The same applies to the drain-source voltage of, for example, 0.2 V for field-effect transistors.

Increased noise does not arise during the switching processes for the LO transistors S1 and S2. The noise produced by the transistors S1 and S2 during the switching processes appears at the output as common-mode noise. Accordingly, the noise power density of the differential output signal is no higher than in the case of an amplifier.

Moreover, higher efficiency can be achieved with the circuit, such as is explained on the basis of FIGS. 5a and 5b. During operation of the circuit as shown in FIG. 1, the two switches need not each be switched on 50% of the time so that a current flows continuously through the mixer circuit. A smaller duty cycle DC of, for example, 10, 15, 20, 25 or 30%, or intermediate values, is also possible. A duty cycle of 25% is shown in FIG. 5b.

While the switches S1 and S2 in FIG. 5a are alternately switched on and off, each switch-on phase in 5b is only 25%, so that no current flows through the mixer circuit from times $t'_{-1}$ to $t'_{+1}$, $t'_{+2}$ to $t'_{-2}$, $t'_{-3}$ to $t'_{+3}$, $t'_{+4}$ to $t'_{-4}$, $t'_{-5}$ to $t'_{+5}$, and $t'_{+6}$ to $t'_{-6}$, for example. Therefore this reduces the current consumption by 50%, because current is only flowing half the time. However, the fundamental frequency component of the LO signal has only been reduced by a factor of the square root of two. Consequently, the output signal as well has only been reduced by a factor of the square root of two. Hence, the efficiency has improved by a factor of the square root of two. This results in a longer battery life for mobile components (UMTS), and reduced heating of the semiconductor chip for base stations (UMTS).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A mixer circuit comprising:
a load circuit;
an oscillator circuit input stage that is operatively connected to a circuit that generates an oscillating signal; and
a signal input stage configured to receive an input signal to be mixed with the oscillating signal,
wherein the oscillator circuit input stage has at least two bipolar transistors, whose bases are operatively connected to the circuit emitting the oscillating signal, whose emitters are operatively connected to a constant voltage that is independent of the oscillating signal, and
wherein the circuit is configured to temporarily turn off a current to the mixer circuit by switching off both of the two bipolar transistors based on the oscillating signal.

2. The mixer circuit according to claim 1, wherein the oscillator circuit input stage is designed such that the bipolar transistors are temporarily driven into saturation as a function of the oscillating signal.

3. The mixer circuit according to claim 1, wherein the oscillator circuit input stage has exactly two bipolar transistors or exactly two bipolar transistor arrays, wherein each bipolar transistor array has exclusively individual bipolar transistors connected in parallel.

4. A mixer circuit comprising:
a load circuit;
an oscillator circuit input stage, which is operatively connected to a circuit that generates an oscillating signal; and
a signal input stage configured to receive an input signal to be mixed with the oscillating signal;
wherein the oscillator circuit input stage has at least two field-effect transistors whose gate connections are operatively connected to the circuit emitting the oscillating signal, whose source connections are connected to a constant voltage that is independent of the oscillating signal, and
wherein the circuit is configured to temporarily turn off a current to the mixer circuit by switching off both of the two field-effect transistors based on the oscillating signal.

5. The mixer circuit according to claim 4, wherein the oscillator circuit input stage is designed such that the field-effect transistors are temporarily driven into the resistive region as a function of the oscillating signal.

6. The mixer circuit according to claim 4, wherein the oscillator circuit input stage has exactly two field-effect transistors or exactly two field-effect transistor arrays, wherein each field-effect transistor array has exclusively individual field-effect transistors connected in parallel.

7. The mixer circuit according to claim 4, wherein the signal input stage has at least two differential amplifiers, wherein each differential amplifier is operatively connected to a transistor of the signal input stage and to a load circuit.

8. The mixer circuit according to claim 7, wherein the differential amplifiers have negative feedback, preferably negative current feedback.

9. The mixer circuit according to claim 4, wherein the oscillator circuit input stage is connected to a driver.

10. A transmitting circuit comprising:
a mixer circuit, the mixer circuit comprising:
a load circuit;
an oscillator circuit input stage that is operatively connected to a circuit that generates an oscillating signal, the circuit temporarily turning off a current to the mixer circuit in dependence of the oscillator signal; and a signal input stage configured to receive an input signal to be mixed,
wherein the oscillator circuit input stage has at least two transistors that are operatively connected to the circuit emitting the oscillating signal, whose emitters are operatively connected to a constant voltage that is independent of the oscillating signal, and
wherein the circuit emitting the oscillating signal is designed to turn on the two transistors of the oscillator circuit input stage in a time-offset manner as a function of the oscillating signal.

11. The transmitting circuit according to claim 10, wherein the circuit for emitting the oscillating signal is designed to temporarily, simultaneously switch off the transistors of the oscillator circuit input stage.

12. The transmitting circuit according to claim 10, wherein the circuit emitting the oscillating signal is designed to turn on the two transistors of the oscillator circuit input stage in a time-offset manner as a function of the oscillating signal.

13. The transmitting circuit according to claim 12, wherein the circuit for emitting the oscillating signal is designed to temporarily, and simultaneously switch off the transistors of the oscillator circuit input stage.

14. The mixer circuit according to claim 1, wherein the mixer circuit is a mixer circuit for a base station or a mobile radio unit of a cellular radio network.

15. The transmitter according to claim 10, wherein the two transistors are bipolar transistors or field-effect transistors.

* * * * *